United States Patent
Mahanpour et al.

[11] Patent Number: 6,076,686
[45] Date of Patent: Jun. 20, 2000

[54] SUPPORT STRUCTURE FOR USE DURING PACKAGE REMOVAL FROM A MULTI-LAYER INTEGRATED CIRCUIT DEVICE

[75] Inventors: Mehrdad Mahanpour, Union City; S. Sidharth, Santa Clara, both of Calif.

[73] Assignee: Advanced Micro Devices, Inc., Sunnyvale, Calif.

[21] Appl. No.: 09/225,365

[22] Filed: Jan. 4, 1999

[51] Int. Cl.[7] ........................................................ A47F 5/00
[52] U.S. Cl. .......................... 211/13.1; 211/26; 211/41.17; 361/820; 361/807; 361/808
[58] Field of Search .......................... 211/13.1, 26, 41.17; 361/820, 807, 808, 767

[56] References Cited

U.S. PATENT DOCUMENTS

| | | | |
|---|---|---|---|
| 5,285,353 | 2/1994 | Buck et al. | 211/41.17 X |
| 5,566,840 | 10/1996 | Waldner et al. | 211/41.17 |
| 5,745,339 | 4/1998 | Bvaumann et al. | 361/820 X |
| 5,905,638 | 5/1999 | MacDonald et al. | 361/769 |
| 5,923,538 | 7/1999 | Hawthorne | 361/820 X |

*Primary Examiner*—Robert W Gibson, Jr.
*Attorney, Agent, or Firm*—Sawyer & Associates

[57] ABSTRACT

Aspects for supporting a package and a device coupled to the package at a device frontside during package removal at a package backside are described. In an exemplary aspect, a support structure includes a support frame supporting the package substantially near end portions of the package, and a set of support braces supporting the package substantially near the device. The structure further includes a block support positioned within the set of support braces and substantially underneath the device at a predetermined distance from the device. Support material is provided between the support frame and the set of support braces and between the block support and the device, wherein breakage of the package during grinding removal of the package is reduced.

13 Claims, 2 Drawing Sheets

US 6,076,686

SUPPORT STRUCTURE FOR USE DURING PACKAGE REMOVAL FROM A MULTI-LAYER INTEGRATED CIRCUIT DEVICE

FIELD OF THE INVENTION

The present invention relates to multi-layer integrated circuit (IC) devices, and more particularly to a support structure for use during package removal from multi-layer IC devices attached at a frontside to the packages.

BACKGROUND OF THE INVENTION

For multi-layer IC devices attached at a frontside to packaging, e.g., oriented in a flip-chip orientation, debugging for defects in the IC is difficult due to having to approach the desired layers from the backside of the device. FIG. 1 illustrates a sideview block diagram of a typical flip-chip configuration. As shown in FIG. 1, an IC device 10 is coupled to a ceramic package 12 (e.g., a C4 package) via solder bumps 14. The solder bumps 14 act as chip-to-carrier interconnects to attach the IC device 10 to the ceramic package 12 and to mate with corresponding pad patterns to form the necessary electrical contacts between the circuit(s) of the IC device 10 and pins of the package 12.

Testing of the circuit remains a challenge due to the upside-down nature of the flip-chip orientation. While the circuit may be approached through the backside layers, such techniques are usually not preferred due to the difficulties associated with having to access the layers in an unconventional order. Further, these techniques normally reduce the thickness of the device to reach the circuit, making the device extremely fragile and cumbersome to handle and utilize during testing. Other attempts involve removal of the package to allow testing from a frontside. However, package removal techniques also carry a risk of device damage when trying to overcome the strong solder bond between the device and the package. Other techniques try to reduce the thickness of the package to assist in the package removal. Unfortunately, these techniques suffer the risk of package breakage.

Accordingly, a need exists for a structure that supports a device during a separation procedure that reduces risk of damage. The present invention addresses such a need.

SUMMARY OF THE INVENTION

The present invention provides for supporting a package and a device coupled to the package at a device frontside during package removal at a package backside. In an exemplary aspect, a support structure includes a support frame supporting the package substantially near end portions of the package, and a set of support braces supporting the package substantially near the device. The structure further includes a block support positioned within the set of support braces and substantially underneath the device at a predetermined distance from the device. Support material is provided between the support frame and the set of support braces and between the block support and the device, wherein breakage of the package during grinding removal of the package is reduced.

Through the present invention, reduced risk of package breakage is achieved during grinding. Thus, greater precision and accuracy of package thinning may be performed without device damage, which creates greater opportunity for successful subsequent utilization of the device, such as for device testing. These and other advantages of the aspects of the present invention will be more fully understood in conjunction with the following detailed description and accompanying drawings.

DETAILED DESCRIPTION

The present invention relates to a support structure for integrated circuit devices coupled at a frontside to a package during package removal. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 2:
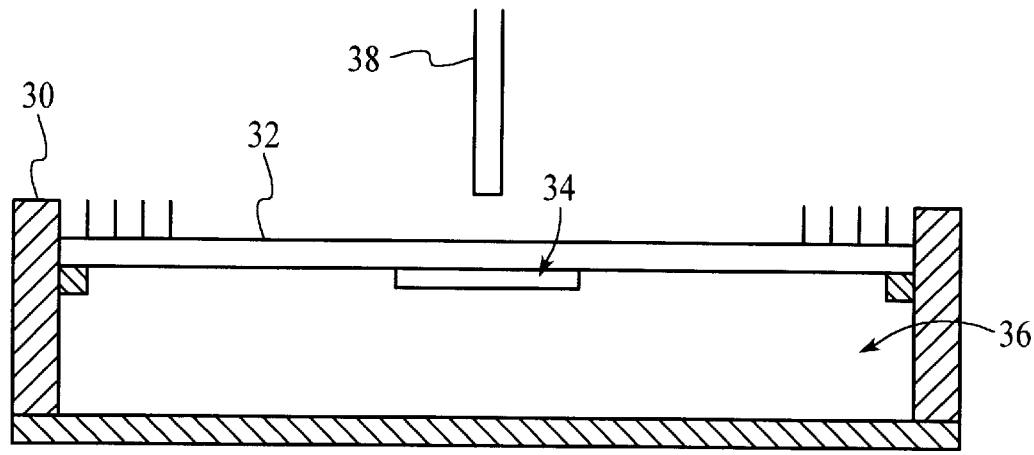
FIG. 2 illustrates a sideview of a prior art support structure and device arrangement used during grinding removal of a package from a device coupled at its frontside to the package.

A prior art support structure is illustrated in FIG. 2. The structure includes a support frame 30 for holding the package 32. Between the device 34 and support frame 30, soft wax 36, e.g., paraffin wax, is conventionally used to further support the device 34 and package 32. The structure allows use of a milling tool 38, such as a Chip-Unzip machine from Hypervision of Fremont, Calif. to grind away a portion of the ceramic package 32 attached to the device 34. As the package 32 is thinned down by the milling tool 38, heat created by friction tends to soften the wax 36. The whole package assembly then bends and cracks at the thinned package layer 32. Separation of the package 32 from the device 34 is extremely hindered once the cracking occurs.

Figure 3:
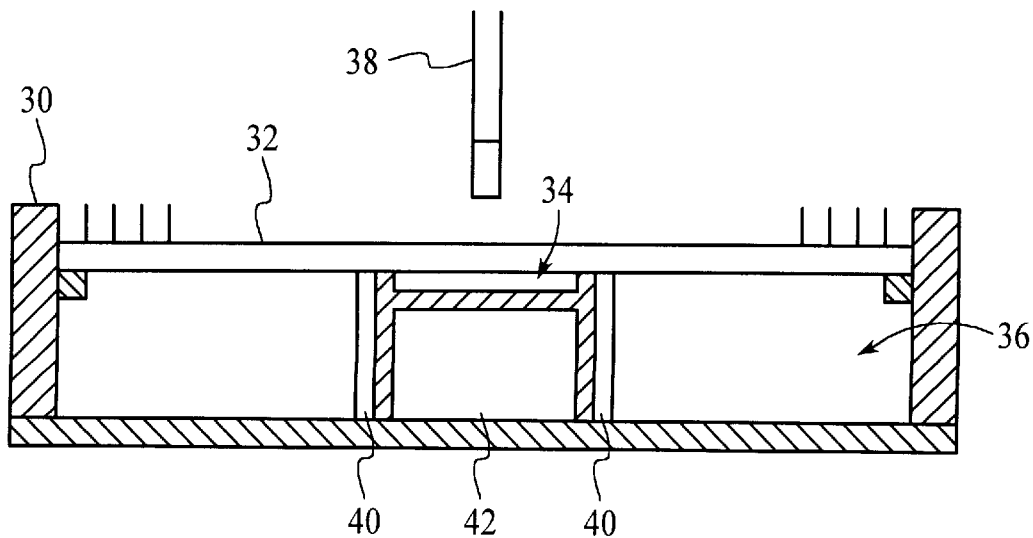
FIG. 3 illustrates a sideview diagram of a support structure arrangement in accordance with the present invention.

In accordance with the present invention, an improved support structure is provided that reduces the risk of breakage and device damage. FIG. 3 illustrates a diagram of the improved support structure. In the arrangement of FIG. 3, the support frame 30 is utilized, as in the prior art. However, a set of support braces 40 is provided nearer to the device 34 to make the structure have better rigidity during the grinding. Further included is block support 42, e.g., a metal block, such as an aluminum block, positioned underneath the device 34 with a gap of a predetermined distance, e.g., about 200 microns, between the block support 42 and device 34, so as to not damage the device 34. Wax is preferably used, such that a hydrostatic pressure is created in the gap to achieve support of the device 34 without actually having contact with the block support 42 when the milling tool 38 grinds down the package 32. A hard wax is suitable, such as a clear mounting wax, also known as jewelers wax, that melts at about 160 EC and can be dissolved in acetone.

Figure 1:
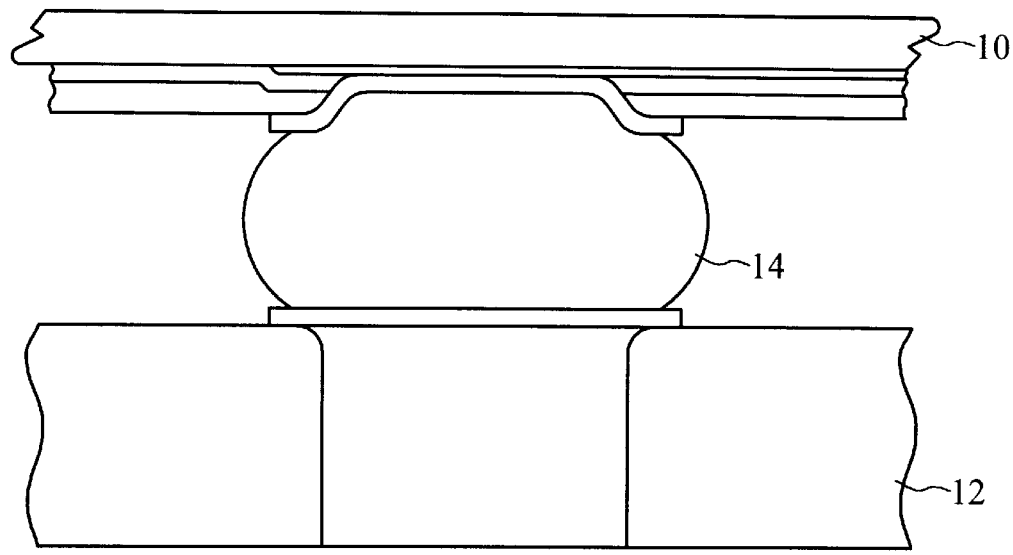
FIG. 1 illustrates a sideview diagram of a typical flip-chip multi-layer integrated circuit.
Figure 4:
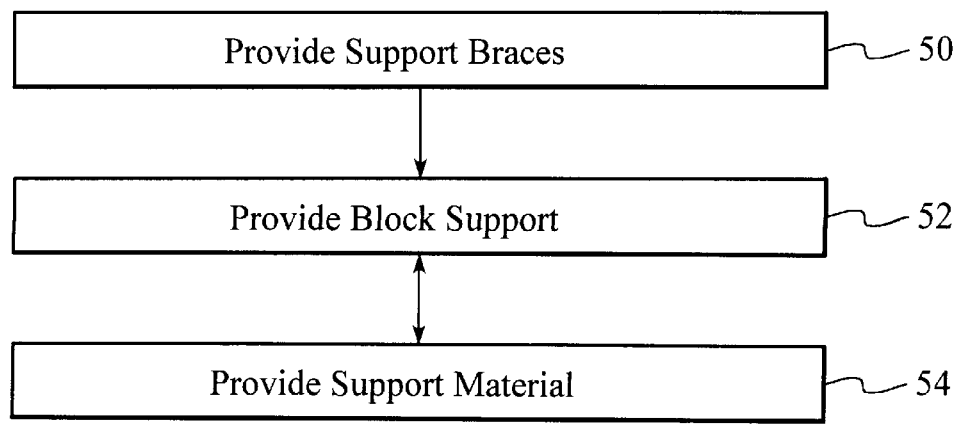
FIG. 4 illustrates a flow diagram of a technique for improving support for a device during package removal in accordance with the present invention.

FIG. 4 illustrates a flow diagram of a technique for improving support for a device during package removal. The technique includes providing a set of support braces (step 50), the set of support braces positioned substantially nearer to the device than a standard support frame positioned substantially near package end portions. The technique further includes providing a block support between the set of support braces substantially underneath the device and at a predetermined distance from the device (step 52). Support material is also provided (step 54), such that a soft wax is provided between the standard support frame and the set of support braces, and a hard wax is provided between the block support and the device.

With the improved support structure arrangement of the present invention, a reduced risk of package breakage is achieved during grinding. Thus, greater precision and accuracy of package thinning may be performed without device damage, which creates greater opportunity for successful subsequent utilization of the device, such as for device testing.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. A support structure for supporting a package and device coupled to the package at a device frontside during package removal at a package backside, the support structure comprising:

a support frame supporting the package substantially near end portions of the package;

a set of support braces supporting the package substantially near the device;

a block support positioned within the set of support braces and substantially underneath the device at a predetermined distance from the device; and support material provided between the support frame and the set of support braces and between the block support and the device, wherein breakage of the package during grinding removal of the package is reduced.

2. The structure of claim 1 wherein the support material further comprises a soft wax material between the support frame and the set of support braces and a hard wax between the block support and the device.

3. The structure of claim 1 wherein the block support comprises a metal block.

4. The structure of claim 3 wherein the metal block comprises an aluminum block.

5. A technique for achieving support of a package and device coupled to the package at a frontside during package removal at a package backside, the technique comprising:

providing a support frame for supporting the package substantially near end portions of the package;

providing a set of support braces within the support frame to further support the package;

providing a block support between the set of support braces substantially underneath the device and at a predetermined distance from the device; and providing support material between the support frame and the set of support braces and between the block support and the device.

6. The technique of claim 5 wherein providing a set of support braces further comprises positioning the set of support braces substantially near to the device.

7. The technique of claim 5 wherein providing support material further comprises providing soft wax and hard wax material.

8. The technique of claim 5 wherein providing a block support further comprises providing a metal block.

9. The technique of claim 8 wherein providing a metal block further comprises providing an aluminum block.

10. A system for removing a substantial portion of a ceramic package from a flip-chip device, the system comprising:

a support structure, the support structure including:

a support frame supporting the package substantially near end portions of the package;

a set of support braces supporting the package substantially near the device;

a block support positioned within the set of support braces and substantially underneath the device at a predetermined distance from the device; and support material provided between the support frame and the set of support braces and between the block support and the device, wherein breakage of the package during grinding removal of the package is reduced; and a grinding tool, the grinding tool for grinding the ceramic package held by the support structure to substantially remove the ceramic package from the device, wherein the support structure reduces a risk of ceramic package breakage due to friction heat created by the grinding of the grinding tool.

11. The system of claim 10 wherein the support material further comprises a soft wax material between the support frame and the second set of support braces and a hard wax between the block support and the device.

12. The system of claim 10 wherein the block support comprises a metal block.

13. The system of claim 12 wherein the metal block comprises an aluminum block.

* * * * *